(12) United States Patent
Zhang et al.

(10) Patent No.: US 11,990,505 B2
(45) Date of Patent: May 21, 2024

(54) TRANSIENT-VOLTAGE-SUPPRESSION PROTECTION DEVICE, MANUFACTURING PROCESS AND ELECTRONIC PRODUCT

(71) Applicant: WILL SEMICONDUCTOR CO., LTD.SHANGHAI, Shanghai (CN)

(72) Inventors: Fusheng Zhang, Shanghai (CN); Chengzong Xu, Shanghai (CN)

(73) Assignee: WILL SEMICONDUCTOR CO., LTD.SHANGHAI, Shanghai (CN)

( * ) Notice: Subject to any disclaimer, the term of this patent is extended or adjusted under 35 U.S.C. 154(b) by 231 days.

(21) Appl. No.: 17/424,003

(22) PCT Filed: Apr. 29, 2020

(86) PCT No.: PCT/CN2020/087729
§ 371 (c)(1),
(2) Date: Jul. 19, 2021

(87) PCT Pub. No.: WO2021/217482
PCT Pub. Date: Nov. 4, 2021

(65) Prior Publication Data
US 2022/0344454 A1      Oct. 27, 2022

(30) Foreign Application Priority Data

Apr. 27, 2020   (CN) .......................... 202010345922.1

(51) Int. Cl.
*H01L 29/06*       (2006.01)
*H01L 29/10*       (2006.01)
*H01L 29/66*       (2006.01)

(52) U.S. Cl.
CPC ...... *H01L 29/0615* (2013.01); *H01L 29/0646* (2013.01); *H01L 29/1058* (2013.01); *H01L 29/66833* (2013.01)

(58) Field of Classification Search
CPC ............. H01L 29/0615; H01L 29/0646; H01L 29/1058; H01L 29/66833
See application file for complete search history.

(56) References Cited

U.S. PATENT DOCUMENTS

| | | | |
|---|---|---|---|
| 2014/0126091 A1* | 5/2014 | Gill | H01L 27/0259 438/328 |
| 2015/0102384 A1* | 4/2015 | Zhan | H01L 27/0248 438/353 |
| 2016/0005730 A1* | 1/2016 | Zhan | H01L 29/6625 438/311 |

(Continued)

*Primary Examiner* — Eugene Lee
(74) *Attorney, Agent, or Firm* — Maier & Maier, PLLC

(57) ABSTRACT

A transient-voltage-suppression protection device and a manufacturing process therefor, and an electronic product. The transient-voltage-suppression protection device includes a substrate, a first trap, a second trap, a first injection region, and a second injection region, where the first trap and the second trap are sequentially arranged on the substrate from left to right at an interval, have a same doping type that is opposite to a doping type of the substrate, and are respectively provided with the first injection region and the second injection region with opposite doping types. The electronic product includes the transient-voltage-suppression protection device. In the solutions described, protection can be triggered and started at a lower voltage; the capacitance is small, and the manufacturing process is simple.

7 Claims, 2 Drawing Sheets

(56) References Cited

U.S. PATENT DOCUMENTS

| | | | |
|---|---|---|---|
| 2016/0126236 A1* | 5/2016 | Heminger | H01L 21/8222 |
| | | | 438/330 |
| 2021/0118870 A1* | 4/2021 | Chen | H01L 29/0649 |
| 2021/0343582 A1* | 11/2021 | Summerland | H01L 27/067 |

* cited by examiner

TRANSIENT-VOLTAGE-SUPPRESSION PROTECTION DEVICE, MANUFACTURING PROCESS AND ELECTRONIC PRODUCT

CROSS-REFERENCE TO RELATED APPLICATIONS

The present application claims priority to Chinese Patent Application No. 202010345922.1 filed with the China National Intellectual Property Administration on Apr. 27, 2020 and entitled "Transient-voltage-suppression protection device and manufacturing process therefor, and electronic product", which is incorporated herein by reference in its entirety.

TECHNICAL FIELD

Embodiments of the present invention relate to the technical field of integrated circuits, and in particular, to a transient-voltage-suppression protection device and a manufacturing process therefor, and an electronic product.

BACKGROUND

As the signal transmission rate of electronic products is constantly increasing, a process of back-end IC devices is becoming increasingly advanced, but the electronic products have weaker and weaker tolerance to electrostatic discharge (ESD) and electrical overstress (EOS). Therefore, it is necessary to add a transient-voltage-suppression protection device (TVS) to protect back-end ICs of the electronic products, and higher requirements for TVS devices are put forward.

However, existing low-capacitance TVS products have the problems of complex process and higher trigger voltage, and have great problems in the protection of back-end ICs.

SUMMARY

It is an object of embodiments of the present invention to overcome or at least partially solve or alleviate the above problems.

Another object of the embodiments of the present invention is to provide a transient-voltage-suppression protection device and a manufacturing process therefor, and an electronic product, which can trigger and start a protection function at a lower voltage; the device capacitance is small, and the manufacturing process is simple.

In a first aspect, an embodiment of the present invention discloses a transient-voltage-suppression protection device, including a substrate, a first trap, a second trap, a first injection region, and a second injection region;

the first trap and the second trap are sequentially arranged on the substrate from left to right at an interval, have a same doping type that is opposite to a doping type of the substrate, and are respectively provided with the first injection region and the second injection region with opposite doping types; and the substrate serves as a common collector, the first trap and the second trap serve as bases respectively, and the first injection region and the second injection region are respectively connected via a metal and led out as emitters.

In a preferred embodiment of the present invention, a PN junction formed between the first trap and the substrate has the same junction depth as a PN junction formed between the second trap and the substrate, and a PN junction formed between the first injection region and the first trap has the same junction depth as a PN junction formed between the second injection region and the second trap.

In a preferred embodiment of the present invention, the first trap and the second trap have a same doping concentration, and the first injection region and the second injection region have a same doping concentration.

In a preferred embodiment of the present invention, the first injection region and the second injection region are arranged at central positions of the first trap and the second trap respectively.

In a preferred embodiment of the present invention, there is a spacing distance of 5-20 μm between the first trap and the second trap.

In a preferred embodiment of the present invention, the substrate as the collector has a resistivity of 30-1500 Ω·cm.

Compared with the prior art, the embodiment of the present invention provides the transient-voltage-suppression protection device. The first trap and the second trap that are arranged from left to right at an interval are formed on the substrate, where the first trap and the second trap have the same doping type that is opposite to the doping type of the substrate, and are respectively provided with the first injection region and the second injection region with opposite doping types. The first trap and the second trap share one substrate as a common collector. In this way, the semiconductor punch-through characteristics can be utilized to solve the problem that the unidirectional cut-off characteristics of a high-resistance substrate triode make the device fail to be normally and independently applied. The protection device provided in the embodiment of the present invention is formed by connecting in series two open-base triodes with the common collector, which can trigger and start protection at a lower voltage, thereby reducing the capacitance of the device by a half, obtaining smaller capacitance and having a higher anti-surge and electrostatic capacity.

An embodiment of the present invention further provides another transient-voltage-suppression protection device, including a substrate, an epitaxial layer, a first trap, a second trap, a first injection region, and a second injection region; where the epitaxial layer is arranged on the substrate, and the first trap and the second trap are sequentially arranged on the epitaxial layer from left to right at an interval, have a same doping type that is opposite to a doping type of the epitaxial layer, and are respectively provided with the first injection region and the second injection region with opposite doping types; and the epitaxial layer serves as a common collector, the first trap and the second trap serve as bases respectively, and the first injection region and the second injection region are respectively connected via a metal and led out as emitters.

In a preferred embodiment of the present invention, a PN junction formed between the first trap and the epitaxial layer has the same junction depth as a PN junction formed between the second trap and the epitaxial layer, and a PN junction formed between the first injection region and the first trap has the same junction depth as a PN junction formed between the second injection region and the second trap.

In a preferred embodiment of the present invention, the first trap and the second trap have a same doping concentration, and the first injection region and the second injection region have a same doping concentration.

In a preferred embodiment of the present invention, the epitaxial layer has a smaller doping concentration than the substrate.

In a preferred embodiment of the present invention, the epitaxial layer and the substrate have a same doping type or different doping types.

In a preferred embodiment of the present invention, the first injection region and the second injection region are arranged at central positions of the first trap and the second trap respectively.

In a preferred embodiment of the present invention, there is a spacing distance of 5-20 μm between the first trap and the second trap.

In a preferred embodiment of the present invention, the epitaxial layer as the collector has a resistivity of 30-1500 Ω·cm.

Compared with the prior art, the embodiment of the present invention provides the transient-voltage-suppression protection device. The first trap and the second trap that are arranged from left to right at an interval are formed on the epitaxial layer, where the first trap and the second trap have the same doping type that is opposite to the doping type of the epitaxial layer, and are respectively provided with the first injection region and the second injection region with opposite doping types. The first trap and the second trap share one epitaxial layer as a common collector. In this way, the semiconductor punch-through characteristics can be utilized to solve the problem that the unidirectional cut-off characteristics of a high-resistance substrate triode make the device fail to be normally and independently applied. The protection device provided in the embodiment of the present invention is formed by connecting in series two open-base triodes with the common collector, which can trigger and start protection at a lower voltage, thereby reducing the capacitance of the device by a half, obtaining smaller capacitance and having a higher anti-surge and electrostatic capacity.

In a second aspect, an embodiment of the present invention further provides a manufacturing process for a transient-voltage-suppression protection device, including:

forming a first trap and a second trap with doping types opposite to that of a substrate on the substrate; and forming, in the first trap and the second trap, a first injection region and a second injection region with doping types opposite to those of the first trap and the second trap;

where the substrate serves as a common collector, the first trap and the second trap serve as bases respectively, and the first injection region and the second injection region are respectively connected via a metal and led out as emitters; or forming an epitaxial layer with the same doping type as that of a substrate on the substrate;

forming a first trap and a second trap with doping types opposite to that of the epitaxial layer on the epitaxial layer; and forming, in the first trap and the second trap, a first injection region and a second injection region with doping types opposite to those of the first trap and the second trap;

where the epitaxial layer serves as a common collector, the first trap and the second trap serve as bases respectively, and the first injection region and the second injection region are respectively connected via a metal and led out as emitters.

Compared with the prior art, the manufacturing process for a transient-voltage-suppression protection device provided in the embodiment of the present invention has the same beneficial effects as the transient-voltage-suppression protection device according to any technical solution of the first aspect or the second aspect. Details are omitted herein.

In a third aspect, an embodiment of the present invention further provides an electronic product, including the transient-voltage-suppression protection device according to any technical solution of the first aspect or the second aspect.

Compared with the prior art, the electronic product provided in the embodiment of the present invention has the same beneficial effects as the transient-voltage-suppression protection device according to any technical solution of the first aspect or the second aspect. Details are omitted herein.

BRIEF DESCRIPTION OF DRAWINGS

To describe the technical solutions in the embodiments of the present invention or in the prior art more clearly, the following briefly describes the accompanying drawings required for describing the embodiments or the prior art. Clearly, the accompanying drawings in the following description show merely some embodiments of the present invention, and a person of ordinary skill in the art may derive other accompanying drawings from these accompanying drawings without creative efforts.

DETAILED DESCRIPTION OF THE EMBODIMENTS

Figure 1:
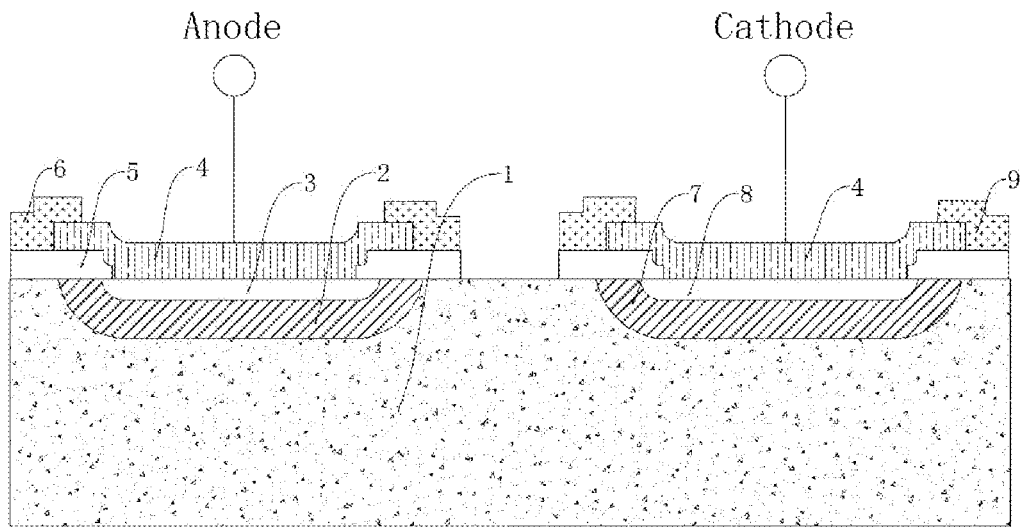
FIG. 1 is a cross-sectional view of a transient-voltage-suppression protection device disclosed in an embodiment of the present invention.

To make the objects, technical solutions and advantages of the embodiments of the present invention clearer, the following clearly and completely describes the technical solutions in the embodiments of the present invention with reference to accompanying drawings in the embodiments of the present invention. Clearly, the described embodiments are some rather than all of the embodiments. All other embodiments obtained by a person of ordinary skill in the art based on the embodiments of the present invention without creative efforts shall fall within the protection scope of the present invention.

The applicant found through research that in the prior art, processes of back-end IC devices are increasingly advanced, but electronic products have weaker and weaker tolerance to ESD and EOS. Therefore, it is necessary to add a transient-voltage-suppression protection device (TVS) to protect back-end ICs of the electronic products, and higher requirements for TVS devices are put forward. However, existing TVS products have the problems of complex process and higher trigger voltage, and have great problems in the protection of back-end ICs.

To solve the above problem, embodiments of the present invention provide a transient-voltage-suppression protection device and a manufacturing process therefor, and an electronic product. In the embodiments of the present invention, a first trap and a second trap that are arranged from left to right at an interval are formed on a substrate or an epitaxial layer, and the first trap and the second trap are respectively provided with a first injection region and a second injection region with opposite doping types, where the first trap and the second trap have the same doping type that is opposite to the doping type of the substrate or the epitaxial layer, and the substrate or the epitaxial layer serves as a common collector for the first trap and the second trap. In the technical solutions provided in the embodiments of the present invention, the semiconductor punch-through characteristics are utilized to solve the problem that the unidirectional cut-off characteristics of a high-resistance substrate triode make the device fail to be normally and independently applied. The protection device provided in the embodiments of the present invention is formed by connecting in series two open-base triodes with the common collector, which can trigger and start protection at a lower voltage, thereby reducing the capacitance of the device by a half, obtaining smaller capacitance and having a higher anti-surge and electrostatic capacity.

Therefore, to solve the above problems, the present invention will be explained in detail by using embodiments below.

Various non-limiting implementations of the present invention are described below in detail with reference to the accompanying drawings.

In a first aspect, a transient-voltage-suppression protection device provided in the embodiments of the present invention is a current control device, which controls an output current via an input current, and has a current amplification function. When the device operates, two carriers, electrons and holes, participate in the conduction process.

A semiconductor triode has three electrodes, which are an emitter, a base and a collector, respectively. When the semiconductor triode operates, it needs to apply a working voltage, so that each electrode current is generated. When the semiconductor triode operates, the emitter current is equal to the sum of the base current and the collector current, where the base current is the smallest and the emitter current is the largest. When a small current is applied to the base, a large current can be output from the collector, so that the triode has an amplification function.

Embodiment 1

As shown in FIG. 1, this embodiment of the present invention provides a transient-voltage-suppression protection device, including an N-type substrate 1, a first P-type trap 2, a second P-type trap 7, a first N-type injection region 3, and a second N-type injection region 8, and further including an interlayer dielectric 5 and a protective layer 6 above the same.

The first P-type trap 2 and the second P-type trap 7 are sequentially arranged on the N-type substrate 1 from left to right at an interval, so that a certain distance is kept between the first P-type trap 2 and the second P-type trap 7, and there is a spacing distance of 5-20 μm between the first P-type trap 2 and the second P-type trap 7. A preset distance between the first P-type trap 2 and the second P-type trap 7 can effectively control the size of the whole protection device and the capacitance of the whole protection device.

The first N-type injection region 3 and the second N-type injection region 8 are arranged at central positions of the first P-type trap 2 and the second P-type trap 7 respectively.

The first P-type trap 2 and the second P-type trap 7 serve as bases, and the bases are in a floating open-circuit state. The first N-type injection region 3 and the second N-type injection region 8 are respectively connected via a metal 4 and led out as emitters. The N-type substrate 1 serves as a common collector. The protection device according to the embodiment of the present invention is formed by connecting in series two open-base triodes with the common collector, which can reduce the capacitance of the device by a half and obtain smaller capacitance.

The N-type substrate 1, the first P-type trap 2, the second P-type trap 7, the first N-type injection region 3, and the second N-type injection region 8 are heavily doped. The doping concentrations of the N-type substrate 1, the first P-type trap 2 and the first N-type injection region 3 sequentially increase, and the doping concentrations of the N-type substrate 1, the second P-type trap 7 and the second N-type injection region 8 sequentially increase.

The first P-type trap 2 and the second P-type trap 7 have the same doping concentration, and the first N-type injection region 3 and the second N-type injection region 8 have the same doping concentration. The first N-type injection region 3 and the second N-type injection region 8 have a doping concentration of $3 \times 10^{15} - 8 \times 10^{15}/cm^2$, and the first P-type trap 2 and the second P-type trap 7 have a doping concentration of $1 \times 10^{13} - 3 \times 10^{14}/cm^2$.

The N-type substrate 1 serving as a collector is a high-resistance substrate with a resistivity of 30-1500 Ω·cm, which can reduce the capacitance of the whole protection device.

It should be noted that the important difference between the collector and the emitter of the triode is that the doping levels are different, the doping concentration of the emitter is much higher, and a PN junction between the collector and the base can bear a high reverse voltage, but a PN junction between the emitter and the base is not configured to bear a high voltage. Therefore, if the emitter is used as the collector, it will lead to a decrease in the voltage resistance of the triode and easily result in breakdown, which is also the reason why the doping level of the collector cannot be too high.

A PN junction formed between the first P-type trap 2 and the N-type substrate 1 has the same junction depth as a PN junction formed between the second P-type trap 7 and the N-type substrate 1, and a PN junction formed between the first N-type injection region 3 and the first P-type trap 2 has the same junction depth as a PN junction formed between the second N-type injection region 8 and the second P-type trap 7. In this way, two completely symmetrical triodes can be connected in series, and the two sides are completely symmetrical, thereby simplifying the manufacturing process.

The protection device according to the embodiment of the present invention is formed by connecting in series two open-base triodes with the common collector, which is equivalent to connecting two triodes in series to implement a bidirectional transient-voltage-suppression protection device, so that no matter which terminal is connected to the anode of a power supply, the final effect achieved is the same.

From the perspective of an NPN technology, an NPN has a vertical structure, with the emitter at the top, the base in the middle and the collector at the bottom. In the embodiment of the present invention, the provided protection device is formed by connecting in series two open-base triodes with the common collector, which can reduce the capacitance of the device by a half and obtain smaller capacitance.

Figure 2:
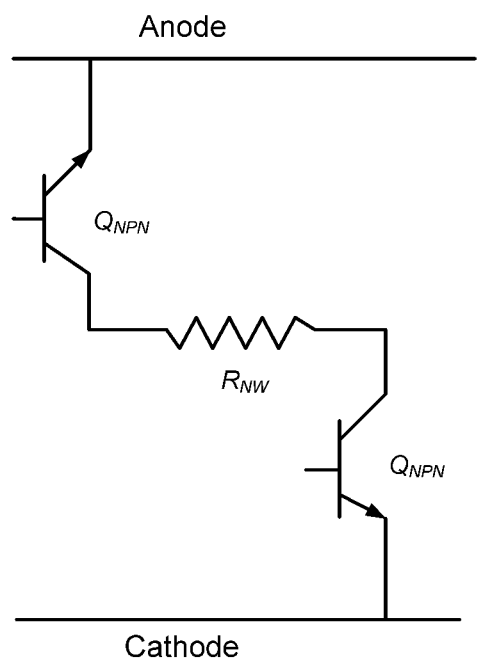
FIG. 2 is an equivalent circuit diagram of a transient-voltage-suppression protection device disclosed in an embodiment of the present invention.

FIG. 2 is an equivalent circuit diagram of a transient-voltage-suppression protection device disclosed in Embodiment 1 of the present invention. If the triode composed of the first P-type trap 2, the first N-type injection region 3, and the N-type substrate 1 is connected to the anode of the power supply, the triode composed of the second P-type trap 7, the second N-type injection region 8 and the N-type substrate 1 is connected to the cathode of the power supply.

The internal resistance of the N-type substrate 1 may be defined as $R_{NW}$. When the triodes are turned on, an emitter current generated by a PN junction formed by the first N-type injection region and the first P-type trap passes through a PN junction formed by the first P-type trap and the N-type substrate, a PN junction formed by the second P-type trap and the N-type substrate, and a PN junction formed by the second N-type injection region and the second P-type trap and reaches the cathode of the power supply. In the embodiment of the present invention, two open-base triodes with the common collector are connected in series, which can reduce the capacitance of the device by a half and obtain smaller capacitance.

If the triode composed of the first P-type trap 2, the first N-type injection region 3, and the N-type substrate 1 is connected to the cathode of the power supply, the triode composed of the second P-type trap 7, the second N-type injection region 8 and the N-type substrate 1 is connected to the anode of the power supply.

The internal resistance of the N-type substrate 1 may be defined as $R_{NW}$. When the triodes are turned on, an emitter current generated by the second N-type injection region and the second P-type trap passes through the PN junction formed by the second P-type trap and the N-type substrate, the PN junction formed by the first P-type trap and the N-type substrate, and the PN junction formed by the first N-type injection region and the first P-type trap and reaches the cathode of the power supply. In the embodiment of the present invention, two open-base triodes with the common collector are connected in series, which can reduce the capacitance of the device by a half and obtain smaller capacitance.

The embodiment of the present invention provides the transient-voltage-suppression protection device. The first trap and the second trap that are arranged from left to right at an interval are formed on the substrate, where the first trap and the second trap have the same doping type that is opposite to the doping type of the substrate, and are respectively provided with the first injection region and the second injection region with opposite doping types. The first trap and the second trap share one substrate as a common collector. In this way, the semiconductor punch-through characteristics can be utilized to solve the problem that the unidirectional cut-off characteristics of a high-resistance substrate triode make the device fail to be normally and independently applied. The protection device provided in the embodiment of the present invention is formed by connecting in series two open-base triodes with the common collector, which can trigger and start protection at a lower voltage, thereby reducing the capacitance of the device by a half, obtaining smaller capacitance and having a higher anti-surge and electrostatic capacity.

Embodiment 2

As shown in FIG. 1, this embodiment of the present invention provides a transient-voltage-suppression protection device, which differs from Embodiment 1 in that the substrate 1 is P-type, the first trap 2 and the second trap 7 are N-type, and the first injection region 3 and the second injection region 8 are P-type; and the protection device further includes an interlayer dielectric 5 and a protective layer 6 above the same.

The first N-type trap 2 and the second N-type trap 7 are sequentially arranged on the P-type substrate 1 from left to right at an interval, so that a certain distance is kept between the first N-type trap 2 and the second N-type trap 7, and there is a spacing distance of 5-20 μm between the first N-type trap 2 and the second N-type trap 7. A preset distance between the first N-type trap 2 and the second N-type trap 7 can effectively control the size of the whole protection device and the capacitance of the whole protection device.

The first P-type injection region 3 and the second P-type injection region 8 are arranged at central positions of the first N-type trap 2 and the second N-type trap 7 respectively.

The first N-type trap 2 and the second N-type trap 7 serve as bases, and the bases are in a floating open-circuit state. The first P-type injection region 3 and the second P-type injection region 8 are respectively connected via a metal 4 and led out as emitters. The P-type substrate 1 serves as a common collector. The protection device according to the embodiment of the present invention is formed by connecting in series two open-base triodes with the common collector, which can reduce the capacitance of the device by a half and obtain smaller capacitance.

The P-type substrate 1, the first N-type trap 2, the second N-type trap 7, the first P-type injection region 3, and the second P-type injection region 8 are heavily doped. The doping concentrations of the P-type substrate 1, the first N-type trap 2 and the first P-type injection region 3 sequentially increase, and the doping concentrations of the P-type substrate 1, the second N-type trap 7 and the second P-type injection region 8 sequentially increase.

The first N-type trap 2 and the second N-type trap 7 have the same doping concentration, and the first P-type injection region 3 and the second P-type injection region 8 have the same doping concentration. The first P-type injection region 3 and the second P-type injection region 8 have a doping concentration of $3\times10^{15}$–$8\times10^{15}$/cm², and the first N-type trap 2 and the second N-type trap 7 have a doping concentration of $1\times10^{13}$–$3\times10^{14}$/cm².

The P-type substrate 1 serving as a collector is a high-resistance substrate with a resistivity of 30-1500 Ω·cm, which can reduce the capacitance of the whole protection device.

A PN junction formed between the first N-type trap 2 and the P-type substrate 1 has the same junction depth as a PN junction formed between the second N-type trap 7 and the P-type substrate 1, and a PN junction formed between the first P-type injection region 3 and the first N-type trap 2 has the same junction depth as a PN junction formed between the second P-type injection region 8 and the second N-type trap 7. In this way, two completely symmetrical triodes can be connected in series, and the two sides are completely symmetrical, thereby simplifying the manufacturing process.

The protection device according to the embodiment of the present invention is formed by connecting in series two open-base triodes with the common collector, which is equivalent to connecting two triodes in series to implement a bidirectional transient-voltage-suppression protection device, so that no matter which terminal is connected to the anode of a power supply, the final effect achieved is the same.

From the perspective of a PNP technology, a PNP has a vertical structure, with the emitter at the top, the base in the middle and the collector at the bottom. In the embodiment of the present invention, the provided protection device is formed by connecting in series two open-base triodes with the common collector, which can reduce the capacitance of the device by a half and obtain smaller capacitance.

Figure 3:
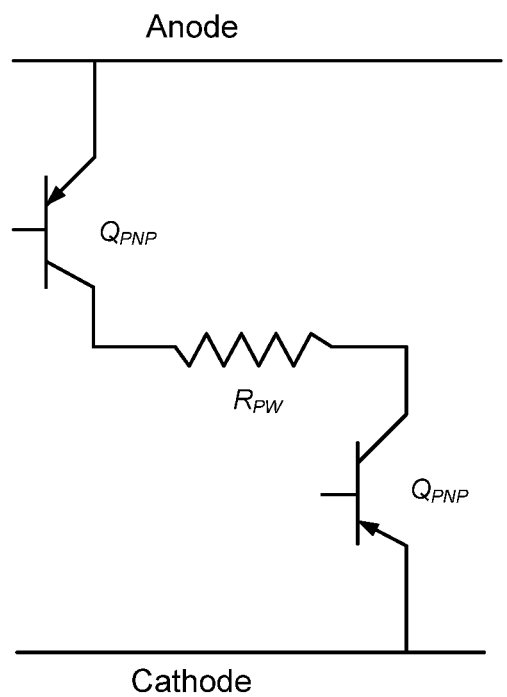
FIG. 3 is an equivalent circuit diagram of a transient-voltage-suppression protection device disclosed in another embodiment of the present invention.

FIG. 3 is an equivalent circuit diagram of a transient-voltage-suppression protection device disclosed in Embodiment 2 of the present invention. If the triode composed of the first N-type trap 2, the first P-type injection region 3, and the P-type substrate 1 is connected to the anode of the power supply, the triode composed of the second N-type trap 7, the second P-type injection region 8 and the P-type substrate 1 is connected to the cathode of the power supply.

The internal resistance of the P-type substrate 1 may be defined as $R_{PW}$. When the triodes are turned on, an emitter current generated by a PN junction formed by the first P-type injection region and the first N-type trap passes through a PN junction formed by the first N-type trap and the P-type substrate, a PN junction formed by the second N-type trap and the P-type substrate, and a PN junction formed by the second P-type injection region and the second N-type trap and reaches the cathode of the power supply. In the embodiment of the present invention, two open-base triodes with the common collector are connected in series, which can reduce the capacitance of the device by a half and obtain smaller capacitance.

If the triode composed of the first N-type trap 2, the first P-type injection region 3, and the P-type substrate 1 is connected to the cathode of the power supply, the triode composed of the second N-type trap 7, the second P-type injection region 8 and the P-type substrate 1 is connected to the anode of the power supply.

The internal resistance of the P-type substrate 1 may be defined as $R_{PW}$. When the triodes are turned on, an emitter current generated by a PN junction formed by the second P-type injection region and the second N-type trap passes through the PN junction formed by the second N-type trap and the P-type substrate, the PN junction formed by the first N-type trap and the P-type substrate, and the PN junction formed by the first P-type injection region and the first N-type trap and reaches the cathode of the power supply. In the embodiment of the present invention, two open-base triodes with the common collector are connected in series, which can reduce the capacitance of the device by a half and obtain smaller capacitance.

The embodiment of the present invention provides the transient-voltage-suppression protection device. The first trap and the second trap that are arranged from left to right at an interval are formed on the substrate, where the first trap and the second trap have the same doping type that is opposite to the doping type of the substrate, and are respectively provided with the first injection region and the second injection region with opposite doping types. The first trap and the second trap share one substrate as a common collector. In this way, the semiconductor punch-through characteristics can be utilized to solve the problem that the unidirectional cut-off characteristics of a high-resistance substrate triode make the device fail to be normally and independently applied. The protection device provided in the embodiment of the present invention is formed by connecting in series two open-base triodes with the common collector, which can trigger and start protection at a lower voltage, thereby reducing the capacitance of the device by a half, obtaining smaller capacitance and having a higher anti-surge and electrostatic capacity.

Embodiment 3

Figure 4:
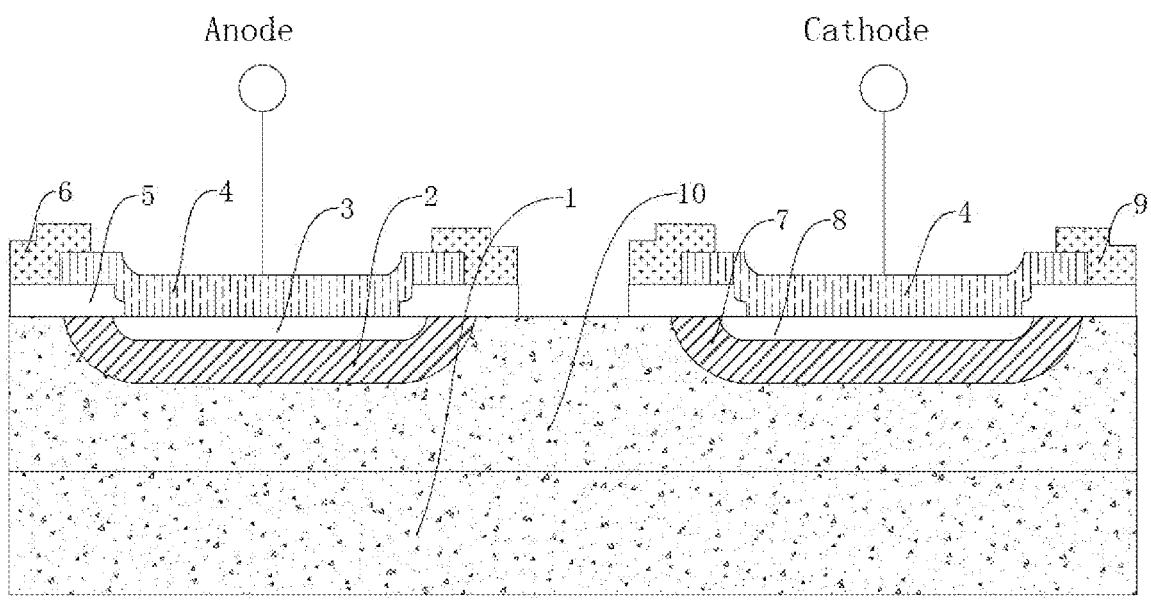
FIG. 4 is a cross-sectional view of a transient-voltage-suppression protection device disclosed in another embodiment of the present invention.

As shown in FIG. 4, different from Embodiment 1 and Embodiment 2, this embodiment of the present invention provides a transient-voltage-suppression protection device, which further includes an epitaxial layer 10 arranged on a substrate 1. The epitaxial layer 10 and the substrate 1 have a same doping type or different doping types, the epitaxial layer 10 is N-type, and the substrate 1 is N-type or P-type. The first P-type trap 2 and the second P-type trap 7 are sequentially arranged on the N-type epitaxial layer 10 from left to right at an interval, and there is a spacing distance of 5-20 µm between the first P-type trap 2 and the second P-type trap 7. A preset distance between the first P-type trap 2 and the second P-type trap 7 can effectively control the size of the whole protection device and the capacitance of the whole protection device.

The first P-type trap 2 and the second P-type trap 7 are respectively provided with the first N-type injection region 3 and the second N-type injection region 8 with opposite doping types.

The first N-type injection region 3 and the second N-type injection region 8 are arranged at central positions of the first P-type trap 2 and the second P-type trap 7 respectively.

The epitaxial layer 10 serves as a common collector, the first P-type trap 2 and the second P-type trap 7 serve as bases respectively, and the bases are in a floating open-circuit state. The first N-type injection region 3 and the second N-type injection region 8 are respectively connected via a metal and led out as emitters.

A PN junction formed between the first P-type trap 2 and the N-type epitaxial layer 10 has the same junction depth as a PN junction formed between the second P-type trap 7 and the N-type epitaxial layer 10, and a PN junction formed between the first N-type injection region 3 and the first P-type trap 2 has the same junction depth as a PN junction formed between the second N-type injection region 8 and the second P-type trap 7. In this way, two completely symmetrical triodes can be connected in series, and the two sides are completely symmetrical, thereby simplifying the manufacturing process.

The N-type epitaxial layer 10 has a smaller doping concentration than the N-type or P-type substrate 1.

The doping concentrations of the N-type epitaxial layer 10, the first P-type trap 2 and the first N-type injection region 3 sequentially increase, and the doping concentrations of the epitaxial layer 10, the second P-type trap 7 and the second N-type injection region 8 sequentially increase.

The N-type epitaxial layer 10 is a high-resistance substrate with a resistivity of 30-1500 Ω·cm, which can reduce the capacitance of the whole protection device.

The protection device according to the embodiment of the present invention is formed by connecting in series two open-base triodes with the common collector, which is equivalent to connecting two triodes in series to implement a bidirectional transient-voltage-suppression protection device, so that no matter which terminal is connected to the anode of a power supply, the final effect achieved is the same.

From the perspective of an NPN technology, an NPN has a vertical structure, with the emitter at the top, the base in the middle and the collector at the bottom. In the embodiment of the present invention, the provided protection device is formed by connecting in series two open-base triodes with the common collector, which can reduce the capacitance of the device by a half and obtain smaller capacitance.

As shown in FIG. 2, if the triode composed of the first P-type trap 2, the first N-type injection region 3, and the N-type epitaxial layer 10 is connected to the anode of the power supply, the triode composed of the second P-type trap 7, the second N-type injection region 8 and the N-type epitaxial layer 10 is connected to the cathode of the power supply.

The internal resistance of the N-type epitaxial layer 10 may be defined as $R_{NW}$. When the triodes are turned on, an emitter current generated by a PN junction formed by the first N-type injection region and the first P-type trap passes through a PN junction formed by the first P-type trap and the N-type epitaxial layer 10, a PN junction formed by the second P-type trap and the N-type epitaxial layer, and a PN junction formed by the second N-type injection region and the second P-type trap and reaches the cathode of the power supply. In the embodiment of the present invention, two open-base triodes with the common collector are connected in series, which can reduce the capacitance of the device by a half and obtain smaller capacitance.

If the triode composed of the first P-type trap 2, the first N-type injection region 3, and the N-type epitaxial layer 10 is connected to the cathode of the power supply, the triode composed of the second P-type trap 7, the second N-type injection region 8 and the N-type epitaxial layer 10 is connected to the anode of the power supply.

The internal resistance of the N-type epitaxial layer 10 may be defined as $R_{NW}$. When the triodes are turned on, an emitter current generated by a PN junction formed by the second N-type injection region and the second P-type trap passes through the PN junction formed by the second P-type trap and the N-type epitaxial layer 10, the PN junction formed by the first P-type trap and the N-type epitaxial layer 10, and the PN junction formed by the first N-type injection region and the first P-type trap and reaches the cathode of the power supply. In the embodiment of the present invention, two open-base triodes with the common collector are connected in series, which can reduce the capacitance of the device by a half and obtain smaller capacitance.

Compared with the prior art, the embodiment of the present invention provides the transient-voltage-suppression protection device. The first trap and the second trap that are arranged from left to right at an interval are formed on the epitaxial layer, where the first trap and the second trap have the same doping type that is opposite to the doping type of the epitaxial layer, and are respectively provided with the first injection region and the second injection region with opposite doping types. The first trap and the second trap share one epitaxial layer as a common collector. In this way, the semiconductor punch-through characteristics can be utilized to solve the problem that the unidirectional cut-off characteristics of a high-resistance substrate triode make the device fail to be normally and independently applied. The protection device provided in the embodiment of the present invention is formed by connecting in series two open-base triodes with the common collector, which can trigger and start protection at a lower voltage, thereby reducing the capacitance of the device by a half, obtaining smaller capacitance and having a higher anti-surge and electrostatic capacity.

Embodiment 4

As shown in FIG. 4, different from Embodiment 1 and Embodiment 2, this embodiment of the present invention provides a transient-voltage-suppression protection device, which further includes an epitaxial layer 10 arranged on a substrate 1. The epitaxial layer 10 and the substrate 1 have a same doping type or different doping types, the epitaxial layer 10 is P-type, and the substrate is N-type or P-type. The first N-type trap 2 and the second N-type trap 7 are sequentially arranged on the P-type epitaxial layer 10 from left to right at an interval, and there is a spacing distance of 5-20 μm between the first N-type trap 2 and the second N-type trap 7. A preset distance between the first N-type trap 2 and the second N-type trap 7 can effectively control the size of the whole protection device and the capacitance of the whole protection device.

The first N-type trap 2 and the second N-type trap 7 are respectively provided with the first P-type injection region 3 and the second P-type injection region 8 with opposite doping types.

The first P-type injection region 3 and the second P-type injection region 8 are arranged at central positions of the first N-type trap 2 and the second N-type trap 7 respectively.

The P-type epitaxial layer 10 serves as a common collector, the first N-type trap 2 and the second N-type trap 7 serve as bases respectively, and the bases are in a floating open-circuit state. The first P-type injection region 3 and the second P-type injection region 8 are respectively connected via a metal and led out as emitters.

A PN junction formed between the first N-type trap 2 and the P-type epitaxial layer 10 has the same junction depth as a PN junction formed between the second N-type trap 7 and the P-type epitaxial layer 10, and a PN junction formed between the first P-type injection region 3 and the first N-type trap 2 has the same junction depth as a PN junction formed between the second P-type injection region 8 and the second N-type trap 7. In this way, two completely symmetrical triodes can be connected in series, and the two sides are completely symmetrical, thereby simplifying the manufacturing process.

The P-type epitaxial layer 10 has a smaller doping concentration than the N-type or P-type substrate 1.

The doping concentrations of the P-type epitaxial layer 10, the first N-type trap 2 and the first P-type injection region 3 sequentially increase, and the doping concentrations of the P-type epitaxial layer 10, the second N-type trap 7 and the second P-type injection region 8 sequentially increase.

The P-type epitaxial layer 10 is a high-resistance substrate with a resistivity of 30-1500 Ω·cm, which can reduce the capacitance of the whole protection device.

The protection device according to the embodiment of the present invention is formed by connecting in series two open-base triodes with the common collector, which is equivalent to connecting two triodes in series to implement a bidirectional transient-voltage-suppression protection device, so that no matter which terminal is connected to the anode of a power supply, the final effect achieved is the same.

From the perspective of a PNP technology, a PNP has a vertical structure, with the emitter at the top, the base in the middle and the collector at the bottom. In the embodiment of the present invention, the provided protection device is formed by connecting in series two open-base triodes with the common collector, which can reduce the capacitance of the device by a half and obtain smaller capacitance.

As shown in FIG. 3, if the triode composed of the first N-type trap 2, the first P-type injection region 3, and the P-type epitaxial layer 10 is connected to the anode of the power supply, the triode composed of the second N-type trap 7, the second P-type injection region 8 and the P-type epitaxial layer 10 is connected to the cathode of the power supply.

The internal resistance of the P-type epitaxial layer 10 may be defined as $R_{PW}$. When the triodes are turned on, an emitter current generated by a PN junction formed by the first P-type injection region and the first N-type trap passes through a PN junction formed by the first N-type trap and the P-type epitaxial layer 10, a PN junction formed by the second N-type trap and the P-type epitaxial layer 10, and a PN junction formed by the second P-type injection region and the second N-type trap and reaches the cathode of the power supply. In the embodiment of the present invention, two open-base triodes with the common collector are connected in series, which can reduce the capacitance of the device by a half and obtain smaller capacitance.

If the triode composed of the first N-type trap 2, the first P-type injection region 3, and the P-type epitaxial layer 10 is connected to the cathode of the power supply, the triode composed of the second N-type trap 7, the second P-type injection region 8 and the P-type epitaxial layer 10 is connected to the anode of the power supply.

The internal resistance of the P-type epitaxial layer 10 may be defined as $R_{NW}$. When the triodes are turned on, an emitter current generated by a PN junction formed by the second P-type injection region and the second N-type trap passes through the PN junction formed by the second N-type trap and the P-type epitaxial layer 10, the PN junction formed by the first N-type trap and the P-type epitaxial layer 10, and the PN junction formed by the first P-type injection region and the first N-type trap and reaches the cathode of the power supply. In the embodiment of the present invention, two open-base triodes with the common collector are connected in series, which can reduce the capacitance of the device by a half and obtain smaller capacitance.

Compared with the prior art, the embodiment of the present invention provides the transient-voltage-suppression protection device. The first trap and the second trap that are arranged from left to right at an interval are formed on the epitaxial layer, where the first trap and the second trap have the same doping type that is opposite to the doping type of the epitaxial layer, and are respectively provided with the first injection region and the second injection region with opposite doping types. The first trap and the second trap share one epitaxial layer as a common collector. In this way, the semiconductor punch-through characteristics can be utilized to solve the problem that the unidirectional cut-off characteristics of a high-resistance substrate triode make the device fail to be normally and independently applied. The protection device provided in the embodiment of the present invention is formed by connecting in series two open-base triodes with the common collector, which can trigger and start protection at a lower voltage, thereby reducing the capacitance of the device by a half, obtaining smaller capacitance and having a higher anti-surge and electrostatic capacity.

In a second aspect, an embodiment of the present invention provides a manufacturing process for a transient-voltage-suppression protection device, which can be used for manufacturing the transient-voltage-suppression protection device.

The transient-voltage-suppression protection device disclosed in Embodiment 1 and Embodiment 2 can be manufactured by the following steps:

forming a first trap and a second trap with doping types opposite to that of a substrate on the substrate; and forming, in the first trap and the second trap, a first injection region and a second injection region with doping types opposite to those of the first trap and the second trap;

where the substrate serves as a common collector, the first trap and the second trap serve as bases respectively, and the first injection region and the second injection region are respectively connected via a metal and led out as emitters.

The transient-voltage-suppression protection device disclosed in Embodiment 3 and Embodiment 4 can be manufactured by the following steps:

forming an epitaxial layer with the same doping type as that of a substrate on the substrate;

forming a first trap and a second trap with doping types opposite to that of the epitaxial layer on the epitaxial layer; and forming, in the first trap and the second trap, a first injection region and a second injection region with doping types opposite to those of the first trap and the second trap;

where the epitaxial layer serves as a common collector, the first trap and the second trap serve as bases respectively, and the first injection region and the second injection region are respectively connected via a metal and led out as emitters.

Compared with the prior art, the embodiment of the present invention provides the manufacturing process for a transient-voltage-suppression protection device. The first trap and the second trap share one substrate or epitaxial layer as a collector. In this way, the semiconductor punch-through characteristics can be utilized to solve the problem that the unidirectional cut-off characteristics of a high-resistance substrate triode make the device fail to be normally and independently applied. In addition, the protection device provided in the embodiment of the present invention is formed by connecting in series two open-base triodes with the common collector, which can trigger and start protection at a lower voltage, reduce the capacitance of the device by a half and obtain smaller capacitance. Besides, the manufacturing process is simple.

In a third aspect, an embodiment of the present invention further provides an electronic product. The electronic product includes the transient-voltage-suppression protection devices described in Embodiments 1 to 4.

Compared with the prior art, the electronic product according to the embodiment of the present invention has the same beneficial effects as the transient-voltage-suppression protection devices described in Embodiments 1 to 4. Details are omitted herein.

The electronic product may be a display terminal, a communication device, an engineering device, or the like, which are not listed herein.

In the description of the above implementations, the specific features, structures or characteristics may be combined in any one or more embodiments or examples in a suitable manner.

Finally, it should be noted that the above embodiments are only used to illustrate the technical solutions of the present invention, rather than constituting a limitation thereto. Although the present invention has been described in detail with reference to the above embodiments, it should be understood by a person of ordinary skill in the art that he/she can still modify the technical solutions described in the above embodiments or equivalently replace some or all technical features therein; and these modifications or replacements do not cause the essence of the corresponding technical solutions to depart from the scope of the technical solutions of various embodiments of the present invention.

What is claimed is:

1. A transient-voltage-suppression protection device, comprising: a substrate, a first trap, a second trap, a first injection region, and a second injection region, and two open-base triodes with a common collector connected in series and provided symmetrically, wherein the two open-base triodes share a same substrate;

one of the two open-base triodes comprises the first trap and the first injection region provided on the first trap;

another of the two open-base triodes comprises the second trap and the second injection region provided on the second trap;

the first trap and the second trap are sequentially arranged on the substrate from left to right at an interval, have a same doping type that is opposite to a doping type of the substrate, and the first injection region and the second injection region have opposite doping types;

the substrate serves as a common collector, the first trap and the second trap serve as bases respectively, and the first injection region and the second injection region are respectively connected via a metal and led out as emitters;

a PN junction formed between the first trap and the substrate has the same junction depth as a PN junction formed between the second trap and the substrate, and a PN junction formed between the first injection region and the first trap has the same junction depth as a PN junction formed between the second injection region and the second trap, doping concentrations of the first trap, the first injection region and the substrate increase sequentially, doping concentrations of the second trap, and the second injection region and the substrate increase sequentially;

the first trap and the second trap have a same doping concentration, and the first injection region and the second injection region have a same doping concentration;

the first injection region and the second injection region are arranged at central positions of the first trap and the second trap respectively;

there is a spacing distance of 5-20 μm between the first trap and the second trap; and the substrate as the collector has a resistivity of 30-1500 Ω·cm.

2. A transient-voltage-suppression protection device, comprising: a substrate, an epitaxial layer, a first trap, a second trap, a first injection region, a second injection region, and two open-base triodes with a common collector connected in series and provided symmetrically, wherein the two open-base triodes share a same substrate and a same epitaxial layer;

one of the two open-base triodes comprises the first trap and the first injection region provided on the first trap;

the other of the two open-base triodes comprises the second trap and the second injection region provided on the second trap;

the epitaxial layer is arranged on the substrate, and the first trap and the second trap are sequentially arranged on the epitaxial layer from left to right at an interval, have a same doping type that is opposite to a doping type of the epitaxial layer, and the first injection region and the second injection region have opposite doping types; and the epitaxial layer serves as a common collector, the first trap and the second trap serve as bases respectively, and the first injection region and the second injection region are respectively connected via a metal and led out as emitters;

a PN junction formed between the first trap and the epitaxial layer has the same junction depth as a PN junction formed between the second trap and the epitaxial layer, and a PN junction formed between the first injection region and the first trap has the same junction depth as a PN junction formed between the second injection region and the second trap, doping concentrations of the first trap, the first injection region and the substrate increase sequentially, and doping concentrations of the second trap, the second injection region, and the substrate increase sequentially;

the first trap and the second trap have a same doping concentration, and the first injection region and the second injection region have a same doping concentration;

the first injection region and the second injection region are arranged at central positions of the first trap and the second trap respectively;

there is a spacing distance of 5-20 μm between the first trap and the second trap; and the substrate as the collector has a resistivity of 30-1500 Ω·cm.

3. The transient-voltage-suppression protection device according to claim 2, wherein the epitaxial layer has a smaller doping concentration than the substrate.

4. The transient-voltage-suppression protection device according to claim 2, wherein the epitaxial layer and the substrate have a same doping type or different doping types.

5. The transient-voltage-suppression protection device according to claim 2, wherein there is a spacing distance of 5-20 μm between the first trap and the second trap.

6. The transient-voltage-suppression protection device according to claim 2, wherein the epitaxial layer as the collector has a resistivity of 30-1500 Ω·cm.

7. An electronic product, comprising the transient-voltage-suppression protection device according to claim 1.

* * * * *